(12) United States Patent
Kurosaki et al.

(10) Patent No.: US 10,680,292 B2
(45) Date of Patent: Jun. 9, 2020

(54) BATTERY MANAGEMENT SYSTEM

(71) Applicant: PANASONIC INTELLECTUAL PROPERTY MANAGEMENT CO., LTD., Osaka-shi, Osaka (JP)

(72) Inventors: Yuta Kurosaki, Osaka (JP); Takahiro Kamikawa, Osaka (JP); Etsushi Aga, Hyogo (JP)

(73) Assignee: PANASONIC INTELLECTUAL PROPERTY MANAGEMENT CO., LTD., Osaka-shi (JP)

( * ) Notice: Subject to any disclaimer, the term of this patent is extended or adjusted under 35 U.S.C. 154(b) by 183 days.

(21) Appl. No.: 16/060,135

(22) PCT Filed: Feb. 17, 2017

(86) PCT No.: PCT/JP2017/005865
§ 371 (c)(1),
(2) Date: Jun. 7, 2018

(87) PCT Pub. No.: WO2017/154516
PCT Pub. Date: Sep. 14, 2017

(65) Prior Publication Data
US 2018/0358662 A1 Dec. 13, 2018

(30) Foreign Application Priority Data
Mar. 10, 2016 (JP) .................. 2016-046517

(51) Int. Cl.
*H01M 10/48* (2006.01)
*H01M 10/42* (2006.01)
(Continued)

(52) U.S. Cl.
CPC ........ *H01M 10/425* (2013.01); *G01R 31/396* (2019.01); *H01M 10/482* (2013.01);
(Continued)

(58) Field of Classification Search
None
See application file for complete search history.

(56) References Cited

U.S. PATENT DOCUMENTS

2014/0333132 A1  11/2014  Yamauchi et al.

FOREIGN PATENT DOCUMENTS

| JP | 3368752 A | 1/2003 |
|----|-----------|--------|
| JP | 2015-82957 A | 4/2015 |

(Continued)

OTHER PUBLICATIONS

International Search Report dated Mar. 14, 2017, issued in counterpart International Application No. PCT/JP2017/005865 (2 pages).

*Primary Examiner* — Wojciech Haske
(74) *Attorney, Agent, or Firm* — Westerman, Hattori, Daniels & Adrian, LLP (57) ABSTRACT

In each of battery modules (120) of a battery block (100) configuring a battery management system (10), a first insulating device having a first insulation distance is disposed between a first region (132) in which a battery side controller (146) is installed and a second region (134) in which a first communication unit (150) is installed. In a control device (200) coupled to the battery block (100) with a communication line, a second insulating device (234) having a second insulation distance is disposed between a relay region (222) and a third region (220) in which a second communication unit is installed, and a third insulating device (236) having a third insulation distance is disposed between the relay region (222) and a fourth region (224) in which a control controller unit (238) is installed.

9 Claims, 6 Drawing Sheets

(51) Int. Cl.
*H02J 7/02* (2016.01)
*H02J 7/00* (2006.01)
*G01R 31/396* (2019.01)
*G01R 31/36* (2020.01)

(52) U.S. Cl.
CPC .......... *H02J 7/0019* (2013.01); *H02J 7/0021* (2013.01); *H02J 7/022* (2013.01); *G01R 31/3648* (2013.01); *H01M 2010/4271* (2013.01); *H01M 2010/4278* (2013.01); *H02J 7/02* (2013.01)

(56) References Cited

FOREIGN PATENT DOCUMENTS

| | | |
|---|---|---|
| WO | 2013/098923 A1 | 7/2013 |
| WO | 2016/114115 A1 | 7/2016 |

BATTERY MANAGEMENT SYSTEM

TECHNICAL FIELD

The present disclosure relates to a battery management system for monitoring a battery.

BACKGROUND ART

Reinforced insulation is required for insulation between a primary side and a secondary side of a power supply device to keep the power supply device in a safe state. Reinforced insulation is single insulation that provides mechanical and electrical protection on a par with double insulation against electric shocks. The double insulation referred to here is made up of basic insulation, i.e., insulation for basic protection against electric shocks, and supplementary insulation, i.e., independent insulation added to the basic insulation to ensure protection against electric shocks if a defect arises in the basic insulation. Functional insulation, which is used to ensure proper operation of equipment, is useful for prevention of ignition and combustion. However, this insulation does not provide protection against electric shocks.

International safety standards define insulation distances needed to ensure insulation in consideration of circuit effective voltages. The defined insulation distances include spatial distance, which is a shortest distance between two conducting parts or between a conducting part and a conductive outer surface of equipment measured through air, and a creepage distance, which is a shortest distance between two conducting parts or between a conducting part and a conductive outer surface of equipment measured along a surface of an insulator.

As described in PTL 1, for example, international standards and guidelines stipulate that an insulation distance for a welding power supply with a circuit effective voltage of 400 V should be 5.5 mm or longer in spatial distance and 6.3 mm or longer in creepage distance to provide basic insulation. The standards also stipulate that insulation between an input circuit and an output circuit should constitute reinforced insulation or double insulation, and an insulation distance should be twice a basic insulation distance, i.e., a spatial distance of 11 mm or longer and a creepage distance of 12.6 mm or longer.

PTL 2 discloses a method of ensuring the expandability of a battery system that includes a plurality of series-coupled battery modules each including a plurality of battery cells. The battery modules have photo-couplers or other insulating devices that are used to communicate information about voltages and other measurements of the respective modules with an upper management device for the battery system. A housing for each battery module has an insulation sheet and a spatial distance between the housing and each of the battery cells contained inside, and thereby maintains insulation from the battery cells.

CITATION LIST

Patent Literature

PTL 1: Japanese Patent No. 3368752
PTL 2: WO 2013/098923 A

SUMMARY OF THE INVENTION

A battery block formed by coupling in series each other a plurality of battery modules and a control device configured to perform control on the battery block are coupled with a communication line. When at least either a case in which the battery modules themselves each have a higher voltage or a case in which a power system coupled in a non-insulated manner might apply a higher transient voltage is assumed in a battery management system, reinforced insulation is required between the battery modules and a user side interface of the control device. For example, if the battery management system is coupled, in a non-insulated manner, with an electric circuit that is categorized to overvoltage category III and that accepts an alternating current (AC) voltage of 400 V, the battery management system needs to be reinforced insulated at a spatial distance of 11 mm or longer. Currently and commercially available, ordinary insulating devices have terminals spaced at up to a little less than 9 mm. Insulating devices with a terminal interspace longer than this length are very expensive. A configuration that implements reinforced insulation with a single insulating device results in an increase in system cost.

When a battery block includes a plurality of battery modules, and when the plurality of battery modules are each internally reinforced insulated, a number of insulating devices used for reinforced insulation is at least required to be equal to a number of the battery modules. A user may demand a battery block in a different specification, and may sometimes later demand additional battery modules. When a battery module is added, a voltage between terminals of the battery block itself rises, leading to higher GND potentials in the battery modules. This requires extending of insulation distances for reinforced insulation in the battery modules, and resetting of the insulation distances and insulating devices, leading to increased time and cost. Thus, it is desirable to have a battery management system that can implement insulation protection more effectively through use of a commercially available, ordinary insulating device, regardless of a specification of a battery block.

A battery management system according to the present disclosure includes a battery block and a control device. The battery block is formed by coupling in series each other a plurality of battery modules. The control device is coupled to the battery block with a communication line. In the battery block, the battery modules each include a battery, a battery side controller, a first communication unit, a battery circuit board, and a first insulating device. The first communication unit is configured to communicate with the control device. The battery circuit board has a first region and a second region. In the first region, the battery side controller is installed. In the second region, the first communication unit is installed. The second region has a GND potential that differs from a GND potential of the first region. The first insulating device couples the first region and the second region at a first insulation distance. The first insulating device is configured to transmit, to the second region, data output from the battery side controller. The control device includes a second communication unit, a control controller unit, a control circuit board, a second insulating device, and a third insulating device. The second communication unit is configured to communicate with the battery block. The control circuit board has a third region, a fourth region, and a relay region. In the third region, the second communication unit is installed. In the fourth region, the control controller unit is installed. A GND potential of the third region and a GND potential of the fourth region differ from each other. The relay region is disposed away at a predetermined second insulation distance from the third region and at a predetermined third insulation distance from the fourth region. The second insulating device couples the third region and the relay region at the second insulation distance. The second insulating device is configured to transmit, to the relay region, data received by the second communication unit. The third insulating device couples the relay region and the fourth region at the third insulation distance. The third insulating device is configured to transmit, to the fourth region, data transmitted by the second insulating device to the relay region. The first insulation distance is shorter than the second insulation distance and the third insulation distance. A required predetermined insulation distance from the first region to the fourth region is set by the second insulating device and the third insulating device.

The battery management system according to the present disclosure can implement insulation protection more effectively through use of a commercially available, ordinary insulating device, regardless of a specification of a battery block.

DESCRIPTION OF EMBODIMENT

An exemplary embodiment of the present disclosure will now be described herein in detail with reference to the accompanying drawings. A battery management system for managing an operating state of a high-voltage battery is described hereafter and this description is provided for purposes of illustration.

Shapes, dimensions, voltages, a number of battery modules, positional relationships, and other particulars described below are provided for purposes of illustration and may be changed as appropriate depending on specifications of battery management systems and other requirements. In all the drawings, identical or equivalent components are denoted by identical reference signs, and redundant descriptions thereof will be omitted.

Figure 1:
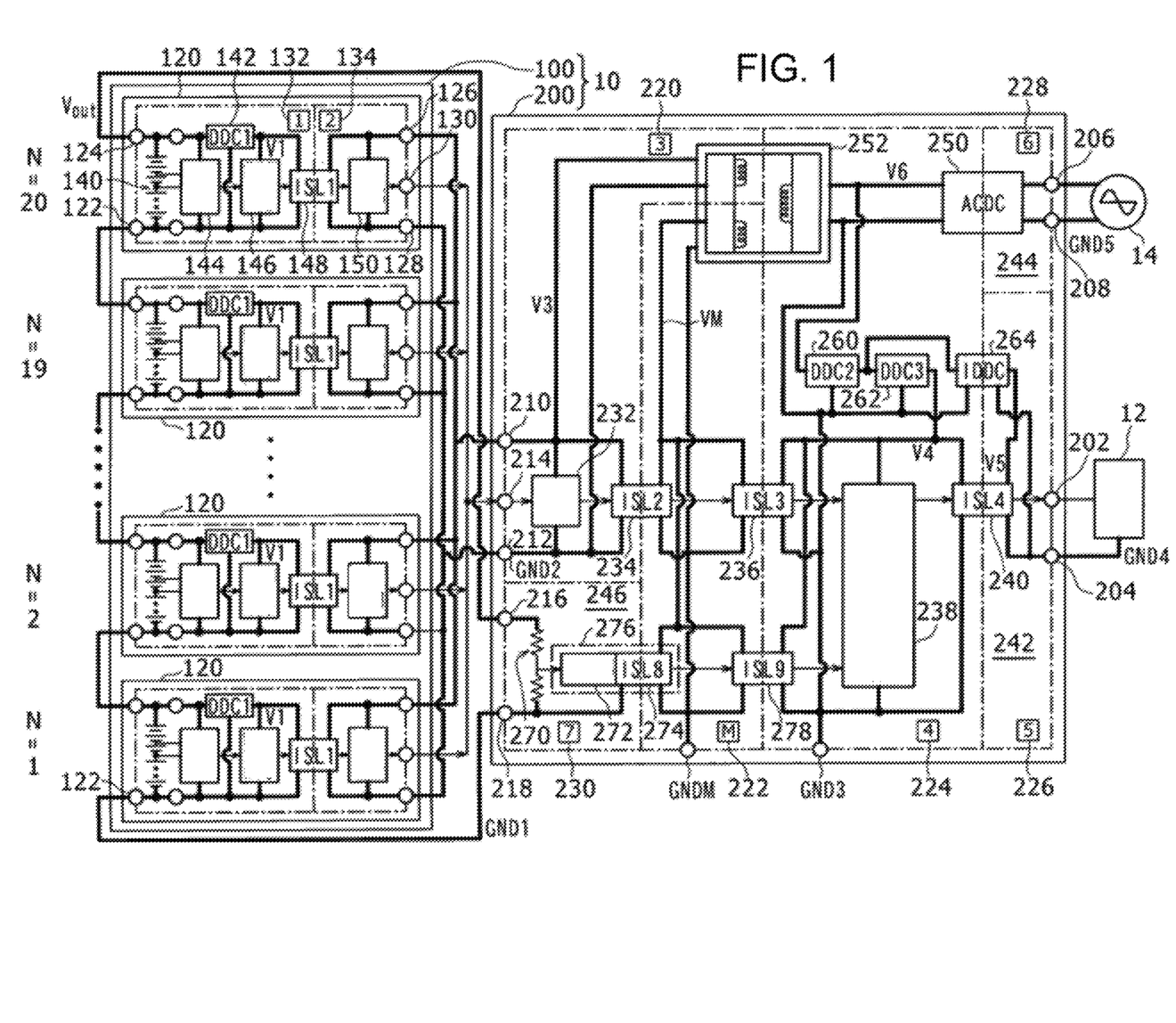
FIG. 1 is a block diagram of a power supply device including a battery management system according to the present disclosure.

A chargeable and dischargeable battery block is coupled to a power system via a power conditioner so that a peak cut and a frequency regulation, for example, can be performed in accordance with a change in power to be demanded for and to be supplied from the power system. FIG. 1 is a block diagram of battery management system 10 including battery block 100 that is an example of such a chargeable and dischargeable battery block, and control device 200 configured to fetch or obtain data on the battery block 100 via a communication line to transmit the data externally. In FIG. 1, power supply wiring is indicated with thick solid lines. On the other hand, signal system wiring is indicated with thin solid lines with arrows. The signal system wiring allows signals to be transmitted in a bidirectional manner between battery block 100 and control device 200. In FIG. 1, the arrows of the signal system wiring respectively indicate flows of signals heading from battery block 100 to control device 200.

Two terminals of battery block 100 for battery management system 10 according to the present disclosure are coupled to the power system via the power conditioner (not shown) in a non-insulated manner. Thus, in consideration of transient voltage that can be applied and other conditions, an insulation distance between each of batteries 140 included in battery block 100 that constitutes a primary circuit and contact parts in control device 200 that constitutes a secondary circuit should be 14 mm or larger in spatial distance.

Battery block 100 is formed by coupling in series a predetermined number of battery modules 120. In FIG. 1, the predetermined number represented by N is 20, and, to distinguish the N pieces of battery modules 120 from each other in FIG. 1, N is indicated as 1, 2, . . . , 19, and 20 in order from a low voltage side, which is a lower side of a stacked body, toward a high voltage side, which is an upper side of the stacked body.

In an example, when a voltage, which is referred to as module voltage, between terminals of one of battery modules 120 is 40 V, and when a number of battery modules, which is represented by N, is 20, 40 V is multiplied by 20, resulting in a voltage between the terminals of battery block 100 of 800 V. This example will be described below. However, this is merely an example. The module voltage may be other than 40 V, as well as N may be other than 20.

A total of 20 battery modules 120 are internally configured identically. So, a configuration of one of battery modules 120, which is N=20, will now be described herein. Battery module 120 includes negative electrode terminal 122 and positive electrode terminal 124. Negative electrode terminal 122 is applied with a power supply voltage of adjacent battery module 120 (N=19) lying on the low voltage side. Positive electrode terminal 124 is applied with a power supply voltage that is a sum of the power supply voltage applied to negative electrode terminal 122 described above and a module voltage of battery module 120 itself. A voltage between positive electrode terminal 124 and negative electrode terminal 122 constitutes a voltage between terminals of battery module 120, which is 40 V. For battery module 120 represented as N=20, negative electrode terminal 122 is supplied with power output from positive electrode terminal 124 of battery module 120 represented as N=19 lying one step below toward the low voltage side. A voltage of negative electrode terminal 122 of battery module 120 represented as N=1 is regarded as a reference potential of batter block 100, and is referred to as GND1 to differentiate from other reference potentials, described later. An output voltage of positive electrode terminal 124 of battery module 120 represented as N=20 is output from output voltage $V_{OUT}$ of battery block 100, which is 800 V.

For data communications with control device 200, battery module 120 includes power supply terminal 126, ground terminal 128, and signal terminal 130. To separate signals for data communications from potentials of negative electrode terminal 122 and positive electrode terminal 124, battery module 120 is separated into first region 132 and second region 134. In first and second regions 132 and 134, reference potentials differ from each other. The reference potential of first region 132 equals to the potential of negative electrode terminal 122. The reference potential of second region 134 equals to a potential of ground terminal 128. Ground terminals 128 of battery modules 120 are coupled to each other to form a single reference potential. In FIG. 1, a potential of each of ground terminals 128 of battery modules 120 is referred to as GND2. In FIG. 1, GND2 is floated relative to a battery line. However, GND2 may be designed to be fixed as a potential at a center point of voltages of the batteries coupled in series.

Battery module 120 includes battery 140 outputting a module voltage. Battery 140 is a chargeable and dischargeable secondary battery, and is also an assembled battery in which a predetermined number of battery cells are coupled in parallel each other to form a parallel connection, and a predetermined number of the parallel connections are further coupled in series each other to form a predetermined number of series connections. Depending on a battery cell type, a voltage between terminals of each of the battery cells ranges from approximately 1 V to approximately 4 V. The battery cells may be lithium ion batteries or nickel hydride batteries. Example predetermined numbers of parallel and series connections are respectively 27 and 13. When one series connection of the 27 battery cells coupled in parallel each other outputs from its terminals a voltage of approximately 3 V, battery 140 outputs from its terminals a module voltage of approximately 40 V.

First voltage converter 142 that is referred to as DDC 1 supplies operation power to a circuit disposed on first region 132. For example, a voltage of approximately 40 V between the terminals of battery 140 is lowered to approximately 5 V and converted to be served as operation power. First voltage converter 142 may be a series regulator technique, non-insulated type direct current-direct current (DC-DC) converter, for example.

In first region 132, monitoring circuit 144 and battery side controller 146 are disposed. Monitoring circuit 144 is voltage detection means having an analog-digital conversion function. Monitoring circuit 144 is configured to detect, for monitoring purpose, a cell voltage per series connection in battery 140, to convert the cell voltage into digital data, and to output the digital data. Battery side controller 146 is a controlling circuit configured to perform signal control in battery module 120, for example. The signal control includes, for example, converting cell voltages transmitted from monitoring circuit 144 into suitable data to be processed in control controller unit 238 of control device 200, described later, and acquiring a state of charge (SOC) indicative of how battery 140 is charged. Battery side controller 146 may be a suitable microprocessor.

First insulating device 148 that is referred to as ISL1 is disposed between first region 132 and second region 134. First insulating device 148 is an element configured to allow electrically insulated signals to transmit between first region 132 and second region 134 respectively having different reference potentials from each other. Widely known insulating devices include, as examples, a digital isolator in which a primary side and a secondary side are magnetically coupled to each other to transmit signals, and an opt-insulated type photo-coupler that includes a photodiode on its primary side and a phototransistor on its secondary side. Here, a bidirectional type insulating device capable of performing both forward path transmission through which signals are transmitted from battery module 120 and return path reception through which signals are received by battery module 120, is used. First region 132 and second region 134 are spatially insulated at a predetermined first insulation distance. First insulating device 148 and the first insulation distance will be described later in detail with reference to FIGS. 2, 4.

First communication unit 150 is installed in second region 134. First communication unit 150 is a transmission and reception circuit configured to allow digital signals to communicate between battery side controller 146 and control controller unit 238 on control device 200. Signals are transmitted to battery side controller 146 via first insulating device 148. Signals are transmitted to control device 200 via signal terminal 130. Operating power for first communication unit 150 is supplied via power supply terminal 126 and ground terminal 128 from control device 200.

The above has described how battery block 100 is configured. Next, how control device 200 coupled to battery block 100 with a communication line is configured will be described herein.

Control device 200 includes signal terminal 202 and terminal 204 that is referred to as GND4, both of which are coupled to external management device 12 served as a user-side external device, and terminals 206, 208 respectively coupled to circuit power supply 14. Control device 200 further includes power supply terminal 210 and ground terminal 212 respectively coupled via power lines to power supply terminal 126 and ground terminal 128 of each of battery modules 120 of battery block 100. Control device 200 further includes, terminals 216 and 218 respectively coupled to output voltage $V_{OUT}$ and GND1 of battery block 100.

Control device 200 includes signal terminal 214. Signal terminal 214 and signal terminal 130 of each of battery modules 120 of battery block 100 are coupled with a communication line. In FIG. 1, a single communication line is indicated. However, the communication line includes a plurality of signal lines that correspond in number to battery modules 120.

External management device 12 coupled to control device 200 via signal terminal 202 is a user-side device coupled to battery management system 10. For example, external management device 12 may be a control device configured to perform charge-discharge control for battery block 100 with a power conditioner (not shown) based on data on an operating state of battery block 100, which is output from battery management system 10. A voltage at which external management device 12 operates differs depending on a user-side specification, and may be approximately 5 V, for example.

Circuit power supply 14 coupled to control device 200 via terminals 206, 208 is an external circuit power supply that is distinct from high-voltage battery block 100. Circuit power supply 14 supplies operating power so as to allow a circuit portion of control device 200 to operate. Circuit power supply 14 is an AC power supply, and may be a commercial power supply configured to supply power at a frequency of 50 Hz or 60 Hz and an effective voltage of 100 V, for example.

Control device 200 is separated into regions respectively having different reference potentials from each other, i.e., third region 220, relay region 222, fourth region 224, fifth region 226, sixth region 228, and seventh region 230. In FIG. 1, the regions are respectively applied with region numbers each surrounded by a rectangular frame so as to be distinct from each other. Relay region 222 is applied with M surrounded by a rectangular frame. Reference potentials, i.e., GND potentials, of the regions are respectively referred to as GND2 for third region 220, GNDM for relay region 222, GND3 for fourth region 224, GND4 for fifth region 226, GND5 for sixth region 228, and GND1 for seventh region 230. The reference potentials are independent from each other. Between regions respectively having different reference potentials from each other, a predetermined insulation distance is required. Securing such a predetermined insulation distance requires an enough spatial distance when no signal is transmitted. To transmit signals, an insulating device having a predetermined insulation distance is used.

In third region 220, second communication unit 232 is disposed. In fourth region 224, control controller unit 238 is disposed. In fifth region 226, user interface unit 242 is disposed. In sixth region 228, circuit power supply coupling unit 244 is disposed. In seventh region 230, voltage measuring unit 246 is disposed. Relay region 222 is disposed between fourth region 224 and a region including third region 220 and seventh region 230.

Second communication unit 232 is a transmission and reception circuit configured to allow digital signals to communicate between battery side controller 146 on battery block 100 and control controller unit 238. Signals are transmitted to battery side controller 146 via signal terminal 130 of each of battery modules 120 and signal terminal 214 of control device 200, using communication lines. Signal terminal 130 of battery module 120 is coupled to first communication unit 150 of battery module 120. Therefore, between battery side controller 146 on battery block 100 and control controller unit 238, digital signals are allowed to communicate between first communication unit 150 and second communication unit 232. As for first communication unit 150 and second communication unit 232, respective power supply terminals 126, 210 are coupled to each other, while respective ground terminals 128, 212 are coupled to each other. In other words, first communication unit 150 and second communication unit 232 respectively have an identical reference potential, which is referred to as GND2, and respectively operate with identical operating power.

Between second communication unit 232 and control controller unit 238, digital data is transmitted via second insulating device 234 that is referred to as ISL2 and third insulating device 236 that is referred to as ISL3. Second insulating device 234 and third insulating device 236 are elements configured to allow electrically insulated signals to transmit, via relay region 222, between third region 220 and fourth region 224 respectively having different reference potentials from each other. Third region 220 and relay region 222, between which second insulating device 234 is disposed, are spatially insulated at a predetermined second insulation distance. Relay region 222 and fourth region 224, between which third insulating device 236 is disposed, are spatially insulated at a predetermined third insulation distance. Second insulating device 234 and third insulating device 236, as well as the second insulation distance and the third insulation distance will be described later in detail with reference to FIGS. 2, 3.

Control controller unit 238 receives digital data on a cell voltage and an SOC transmitted from battery side controller 146, as well as receives data on output voltage $V_{OUT}$ of battery block 100, which is transmitted from voltage measuring unit 246, for example. Control controller unit 238 then outputs digital signals on states of battery modules 120 and battery block 100 based on the received data. Control controller unit 238 may be a suitable microprocessor. In fourth region 224 in which control controller unit 238 is disposed, a peripheral circuit configured to support operation of control controller unit 238 may be provided. For example, such a peripheral circuit may be any kind of a signal processing circuit or a communication circuit.

Between control controller unit 238 and user interface unit 242, digital data is transmitted via fourth insulating device 240 that is referred to as ISL4. Fourth insulating device 240 is an element configured to allow electrically insulated signals to transmit between fourth region 224 and fifth region 226 respectively having different reference potentials from each other. Fourth region 224 and fifth region 226, between which fourth insulating device 240 is disposed, are spatially insulated at a predetermined fourth insulation distance. Fourth insulating device 240 and the fourth insulation distance will be described later in detail with reference to FIG. 2.

User interface unit 242 is configured to regulate signals output from control controller unit 238 into signals suitable for processing in external management device 12, and to transmit the signals. In FIG. 1, signal terminal 202, terminal 204, and wires coupled to the terminals are shown. However, an interface circuit including a suitable protection circuit, for example, may be provided as required.

Circuit power supply coupling unit 244 is configured to receive AC power supplied from circuit power supply 14 to generate operating power for a predetermined circuit. In circuit power supply coupling unit 244, AC-DC power converter 250, which is coupled to terminals 206, 208, and is referred to as ACDC, is disposed. AC-DC power converter 250 is a circuit configured to convert AC power having a frequency of 50 Hz or 60 Hz and an effective voltage of 100 V, which is supplied from circuit power supply 14, into DC power having a predetermined DC voltage. For example, AC-DC power converter 250 in which a diode bridge and a smoothing circuit are combined may be used. A commercial power supply used as circuit power supply 14 can generate a transient voltage. Therefore, AC-DC power converter 250 includes an insulating device, such as a photo-coupler. The included insulating device has a predetermined fifth insulation distance. The fifth insulation distance will be described later with reference to FIG. 2. The included insulating device has a primary side lying in sixth region 228 and facing terminals 206, 208. In sixth region 228, an interface circuit including a suitable protection circuit may be provided as required.

The insulating device included in AC-DC power converter 250 has a secondary side lying in fourth region 224. DC power converted by AC-DC power converter 250 enters into a primary side of multi-output power converting unit 252 that is a magnetically coupled insulating device including a multi-output transformer.

Multi-output power converting unit 252 uses an output of AC-DC power converter 250 as first DC power to generate, from the first DC output, a predetermined plurality of kinds of operating power. Multi-output power converting unit 252 includes, on its primary side, a DC-AC power converting unit and a primary side coil of the multi-output transformer, and, on its secondary side, a plurality of coils on a secondary side, which is collectively referred to as a secondary side coil, of the multi-output transformer and a plurality of AC-DC power converting units. A configuration example will now be described herein. FIG. 1 exemplifies the secondary side coil including the two coils, i.e., a first coil and a second coil, and the two AC-DC power converting units. Multi-output power converting unit 252 is therefore a two-output power converting unit configured to output predetermined two kinds of operating power.

A configuration example of multi-output power converting unit 252 will now be described herein. Multi-output power converting unit 252 includes the DC-AC power converting unit and the two-output transformer. The DC-AC power converting unit is configured to convert first DC power into first AC power. The two-output transformer is configured to accept the first AC power with the primary side coil and to allow the two coils of the secondary side coil to respectively output second AC power and third AC power. Multi-output power converting unit 252 further includes a second power converting unit and a relay power converting unit. The second power converting unit is configured to convert second AC power into second DC power to supply the converted second DC power to third region 220. The relay power converting unit is configured to convert third AC power into relay DC power to supply the converted relay DC power to relay region 222.

In multi-output power converting unit 252, between the primary side coil and the secondary side coil, at least either of an insulation distance or an insulated wire provides an insulation function corresponding to a predetermined sixth insulation distance, while, between the two coils of the secondary side coil, at least either of an insulation distance or an insulated wire provides an insulation function corresponding to a predetermined seventh insulation distance. The sixth and seventh insulation distances will be described later with reference to FIG. 2.

Operating power for the circuits in the regions of control device 200 will now be summarized herein.

Third DC power having a third voltage is supplied to second communication unit 232 disposed on third region 220 having a reference potential that is referred to as GND2, and to a third region side portion of second insulating device 234. The third DC power is DC power converted from second AC power output from one of the two coils of the secondary side coil of multi-output power converting unit 252. In FIG. 1, the third voltage is shown as V3. Similarly, voltages in the regions will each be shown with V added with a region number or symbol. High voltage terminals 210, 126 each have a voltage that is referred to as V3.

Relay DC power having relay region voltage VM is supplied to a relay region side portion of second insulating device 234 and a relay region side portion of third insulating device 236, which are disposed on relay region 222 having a reference potential that is referred to as GNDM. The relay DC power is DC power converted from third AC power output from the other of the two coils of the secondary side coil of multi-output power converting unit 252.

Voltage V4 of control controller unit 238 disposed on fourth region 224 having a reference potential that is referred to as GND3, a fourth region side portion of third insulating device 236, and a fourth region side portion of fourth insulating device 240 is generated from output voltage V6 of AC-DC power converter 250. Output voltage V6 is lowered at two stages, i.e., second voltage converter 260 that is referred to as DDC2 and third voltage converter 262 that is referred to as DDC3. Fourth voltage V4 is then generated. Second voltage converter 260 and third voltage converter 262 may be series regulator technique, non-insulated type DC-DC converters, for example.

To a fifth region side portion of fourth insulating device 240 disposed on fifth region 226 having a reference potential that is referred to as GND4, voltage V5 acquired by lowering an output of second voltage converter 260 with insulated type voltage converter 264 that uses a transformer that is referred to as IDDC is supplied. While second voltage converter 260 and third voltage converter 262 are a series regulator technique, non-insulated type, for example, why voltage converter 264 is an insulated type in which a transformer is used is that voltage converter 264 straddles over fourth region 224 and fifth region 226 respectively having different reference potentials from each other. Insulated type voltage converter 264 has predetermined insulation distance L41. Insulation distance L41 will be described later with reference to FIG. 2.

AC-DC power converter 250 disposed on sixth region 228 operates with power supplied from circuit power supply 14.

GND5, which is a reference potential of sixth region 228, is identical to GND of circuit power supply 14.

Operating power for the circuits ranges in voltage, such as V3=3.3 V, VM=3.3 V, V4=3.3 V, and V5=3.3 V. The voltages are provided for purposes of illustration and may be changed as appropriate depending on a specification of battery management system 10.

The operating power for the circuits in the regions is assumed to be generated from power output from output voltage $V_{OUT}$ of battery block 100. However, the power output from output voltage $V_{OUT}$ has a high voltage. Causing such a high voltage to lower to a voltage at which each of the circuits in the regions operates is disadvantageous in terms of power loss and use of high voltage resistive components in a voltage converter.

Next, voltage measuring unit 246 provided in seventh region 230 will now be described herein. Voltage measuring unit 246 includes voltage dividing resistor unit 270 and analog-digital converter 272 that is referred to as an AD converting unit. Voltage measuring unit 246 is configured to measure a voltage between the terminals of battery block 100. In FIG. 1, a voltage between the terminals of battery block 100 is exemplified to a calculation of $\{V_{OUT}-(\text{potential of GND1})\}$.

Voltage dividing resistor unit 270 is a group of series resistors configured to regulate a voltage between the terminals of battery block 100 to a voltage that falls within an operating range of analog-digital converter 272. Voltage dividing resistor unit 270 has both ends respectively coupled to terminal 216 and terminal 218 of control device 200. Terminal 216 of control device 200 is coupled to positive electrode terminal 124 (N=20) of battery block 100. Terminal 218 of control device 200 is coupled to negative electrode terminal 122 (N=1) of battery block 100. An intermediate terminal of voltage dividing resistor unit 270 is coupled to an input terminal of analog-digital converter 272. The intermediate terminal is used to output a divided voltage corresponding to the voltage between the terminals of battery block 100. Analog-digital converter 272 is configured to convert, into a digital signal, analog data on the divided voltage that is output from the intermediate terminal of voltage dividing resistor unit 270 and that corresponds to the voltage between the terminals of battery block 100. For example, analog-digital converter 272 may be a 16-bit analog-digital converter.

Voltage measuring unit 246 does not measure a voltage of each of battery modules 120 configuring battery block 100, but measures a divided voltage corresponding to the voltage between the terminals of battery block 100. Information on a voltage corresponding to the voltage between the terminals of battery block 100 can promptly be output, compared with a method in which a voltage of each of battery modules 120 is measured, and, based on a result, a voltage between the terminals of battery block 100 is acquired. Battery block 100 can be promptly controlled in accordance with an operating state of each of battery modules 120, as well as an operating state of each of the battery cells in each of battery modules 120.

Between analog-digital converter 272 and control controller unit 238, digital data is transmitted via eighth insulating device 274 that is referred to as ISL8 and ninth insulating device 278 that is referred to as ISL9. Eighth insulating device 274 and ninth insulating device 278 are elements configured to allow electrically insulated signals to transmit, via relay region 222, between seventh region 230 and fourth region 224 respectively having different reference potentials from each other. Seventh region 230 and relay region 222, between which eighth insulating device 274 is disposed, are spatially insulated at a predetermined eighth insulation distance. Relay region 222 and fourth region 224, between which ninth insulating device 278 is disposed, are spatially insulated at a predetermined ninth insulation distance. Eighth insulating device 274 and ninth insulating device 278, as well as the eighth insulation distance and the ninth insulation distance will be described later in detail with reference to FIG. 2.

An integrated circuit for measuring a battery voltage, in which analog-digital converter 272 and eighth insulating device 274 configured to transmit digital data converted by analog-digital converter 272 are assembled into a single package, has been practically used. An integrated circuit for measuring a battery voltage, in which analog-digital converter 272 and a voltage converter are assembled into a single package, has also been practically used. Further, an integrated circuit for measuring a battery voltage, in which analog-digital converter 272, eighth insulating device 274, and a voltage converter are assembled into a single package, has also been practically used. An integrated circuit for use as an insulating device, in which an insulating device and an insulated type DC-DC converter are assembled into a single package, has also been practically used. FIG. 1 exemplifies, as battery voltage measuring circuit 276, an integrated circuit in which analog-digital converter 272, eighth insulating device 274, and an insulated type DC-DC converter are assembled into a single package. In this case, operating power for the circuit in seventh region 230 is DC power generated by battery voltage measuring circuit 276.

A battery voltage measuring integrated circuit that does not include an insulated type DC-DC converter may be used. In such a case, multi-output power converting unit 252 can be used to supply required operating power to the battery voltage measuring integrated circuit. For example, in multi-output power converting unit 252, a three-output transformer may be used, instead of the two-output transformer. Multi-output power converting unit 252 that uses the three-output transformer converts, into first AC power, first DC power supplied from AC-DC power converter 250, and then supplies the first AC power to a primary side coil of the three-output transformer. When three coils configuring a secondary side coil of the three-output transformer are respectively referred to as a first coil, a second coil, and a third coil, the first coil outputs second AC power, the second coil outputs third AC power, and the third coil outputs fourth AC power. From the second AC power and the third AC power, third DC power and relay DC power are respectively generated. Multi-output power converting unit 252 that uses the three-output transformer includes a seventh power converting unit configured to convert fourth AC power into fourth DC power to generate operating power for the circuit in seventh region 230. In this case, the operating power for the circuit in seventh region 230 is fourth DC power output from the secondary side of multi-output power converting unit 252.

In control device 200, third region 220 and seventh region 230 are coupled to battery block 100. Third region 220 has a reference potential that is referred to as GND2. Seventh region 230 has a reference potential that is referred to as GND1. Between third region 220 and seventh region 230, however, no data is transmitted. Therefore, between seventh region 230 and third region 220, no particular insulating device is required to be disposed, and seventh region 230 and third region 220 are electrically insulated fully at a predetermined tenth insulation distance.

In control device 200, fifth region 226 and sixth region 228 are coupled to external devices, other than battery block 100. Fifth region 226 is coupled to external management device 12. Sixth region 228 is coupled to circuit power supply 14. A reference potential of external management device 12 and a reference potential of circuit power supply 14 differ from each other. Accordingly, a reference potential of fifth region 226 and a reference potential of sixth region 228 differ from each other. Therefore, between fifth region 226 and sixth region 228, no particular insulating device is disposed, and fifth region 226 and sixth region 228 are electrically insulated fully at the predetermined tenth insulation distance. The tenth insulation distance will be described later with reference to FIG. 2.

Figure 2:
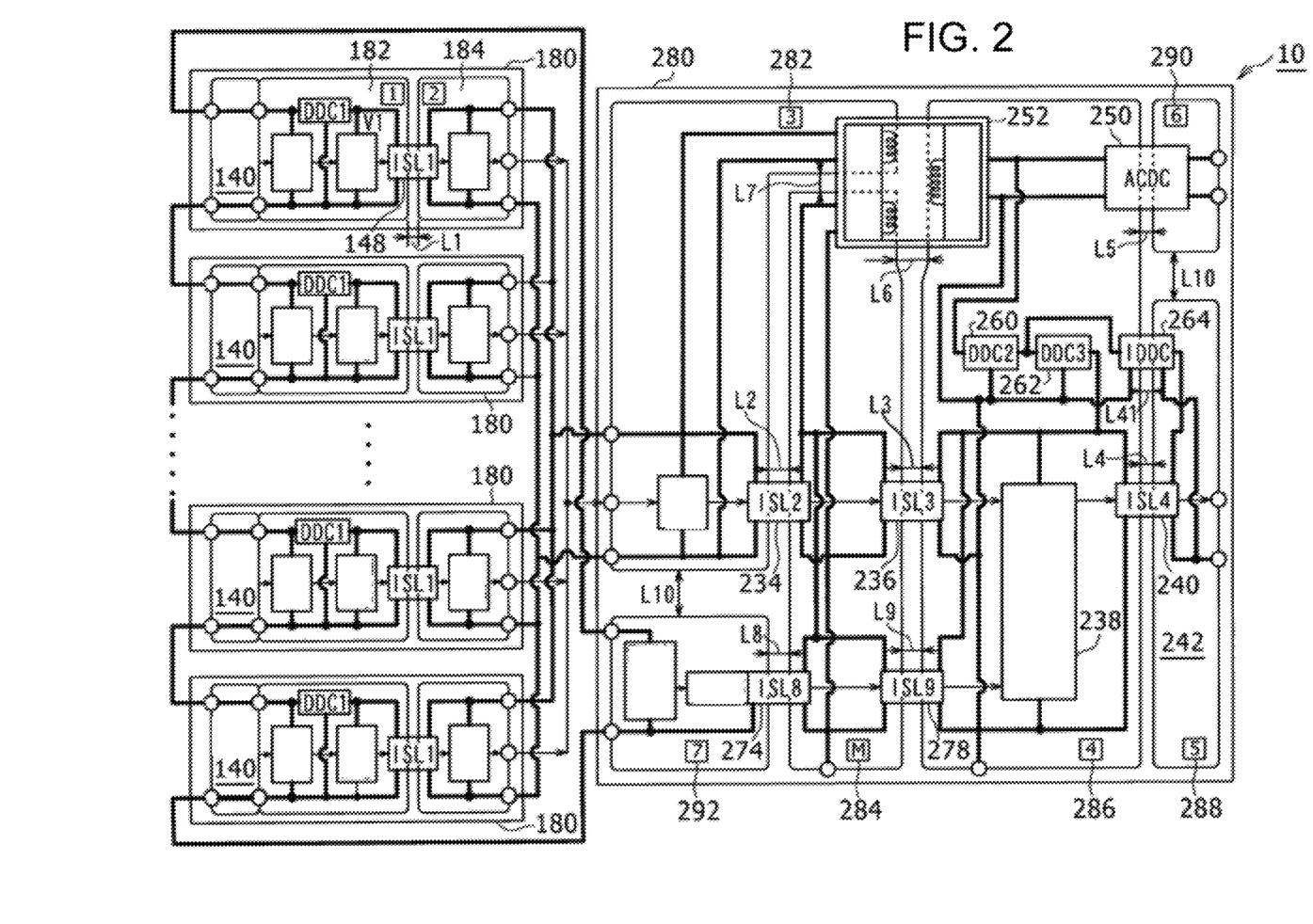
FIG. 2 is a drawing illustrating a battery circuit board and a control circuit board used in the battery management system in FIG. 1.

FIG. 2 is a configuration drawing of battery circuit board 180 of each of battery modules 120 of battery block 100, and control circuit board 280 of control device 200 in battery management system 10 illustrated in FIG. 1. Battery circuit board 180 and control circuit board 280 respectively are formed with conductor wiring patterns in predetermined shapes on insulating substrate 181 (see FIGS. 3, 4). Circuit components are installed on the predetermined conductor wiring patterns. Battery circuit board 180 and control circuit board 280 respectively have a plurality of conductor regions electrically insulated from each other. Each insulation distance between the conductor regions adjacent to each other is as described below.

In correspondence to first region 132 and second region 134, battery circuit board 180 of battery module 120 has first conductor region 182 and second conductor region 184. First conductor region 182 and second conductor region 184 are electrically insulated from each other at first insulation distance L1.

Control circuit board 280 of control device 200 has six regions: third region 220, relay region 222, fourth region 224, fifth region 226, sixth region 228, and seventh region 230. In correspondence to the regions, six conductor regions are included: third conductor region 282, relay conductor region 284, fourth conductor region 286, fifth conductor region 288, sixth conductor region 290, and seventh conductor region 292.

Between third conductor region 282 and relay conductor region 284, signals are transmitted by second insulating device 234. In second insulating device 234, third conductor region 282 and relay conductor region 284 are electrically insulated from each other at second insulation distance L2.

Between relay conductor region 284 and fourth conductor region 286, signals are transmitted by third insulating device 236. In third insulating device 236, relay conductor region 284 and fourth conductor region 286 are electrically insulated from each other at third insulation distance L3.

Between fourth conductor region 286 and fifth conductor region 288, signals are transmitted by fourth insulating device 240. In fourth insulating device 240, fourth conductor region 286 and fifth conductor region 288 are electrically insulated from each other at fourth insulation distance L4.

Fourth conductor region 286 and sixth conductor region 290 are insulated by an insulating device included in AC-DC power converter 250. In the insulating device included in AC-DC power converter 250, fourth conductor region 286 and sixth conductor region 290 are electrically insulated from each other at fifth insulation distance L5.

Multi-output power converting unit 252 is disposed so as to straddle over fourth conductor region 286, third conductor region 282, and relay conductor region 284. Regions of multi-output power converting unit 252 are insulated through spatial insulation between the primary side coil and the secondary side coil of multi-output power converting unit 252. Between the primary side coil and the secondary side coil of multi-output power converting unit 252, fourth conductor region 286 is electrically insulated from third conductor region 282 and relay conductor region 284 at sixth insulation distance L6. For example, the primary side coil and the secondary side coil of multi-output power converting unit 252 may be insulated at a required distance corresponding to sixth insulation distance L6 by using an insulating film of a coil wire, such as a three-layered, insulated wire. In this case, terminals of the primary and secondary side coils respectively coupled to the conductor wiring pattern of the circuit board are disposed away from each other at sixth insulation distance L6. Between the two coils on the secondary side of multi-output power converting unit 252, third conductor region 282 and relay conductor region 284 are electrically insulated from each other at seventh insulation distance L7. For example, the two coils on the secondary side of multi-output power converting unit 252 may be insulated at a required distance corresponding to seventh insulation distance L7 by using an insulating film of a coil wire, such as a three-layered, insulated wire. In this case, the terminals of the two coils on the secondary side, respectively coupled to the conductor wiring pattern of the circuit board, are disposed away from each other at seventh insulation distance L7.

Between seventh conductor region 292 and relay conductor region 284, signals are transmitted by eighth insulating device 274. In eighth insulating device 274, seventh conductor region 292 and relay conductor region 284 are electrically insulated from each other at eighth insulation distance L8.

Signals transmitted from seventh conductor region 292, via eighth insulating device 274, to relay conductor region 284 are transmitted to fourth conductor region 286 by ninth insulating device 278. In ninth insulating device 278, relay conductor region 284 and fourth conductor region 286 are electrically insulated from each other at ninth insulation distance L9.

Between fifth conductor region 288 and sixth conductor region 290, and between third conductor region 282 and seventh conductor region 292, no signal is transmitted. However, the regions respectively have different reference potentials from each other, and therefore are electrically insulated from each other at tenth insulation distance L10.

As described above, in control circuit board 280 of control device 200, the conductor regions adjacent to each other are electrically insulated from each other at a distance ranging from second insulation distance L2 to tenth insulation distance L10.

In battery management system 10 according to the present disclosure, a total of the insulation distances is required to satisfy an insulation distance of 14 mm or longer that is specified based on safety standards in consideration of a voltage of approximately 800 V between the terminals of battery block 100 and a transient voltage that may be applied from the power system. The insulation distance of 14 mm required by the safety standards needs to be secured between first conductor region 182 in which battery 140 of battery module 120 is disposed and fifth conductor region 288 in which user interface unit 242 is disposed. The insulation distance of 14 mm required by the safety standards also needs to be secured between seventh conductor region 292 in which voltage measuring unit 246 configured to measure a voltage between the terminals of battery block 100 is disposed and fifth conductor region 288 in which user interface unit 242 is disposed.

FIG. 2 exemplifies that second insulation distance L2=third insulation distance L3=7 mm. FIG. 2 also exemplifies that second insulation distance L2=eighth insulation distance L8=seventh insulation distance L7, third insulation distance L3=ninth insulation distance L9, and sixth insulation distance L6=(second insulation distance L2+third insulation distance L3)=(eighth insulation distance L8+ninth insulation distance L9)=14 mm. Therefore, between first conductor region 182 and fifth conductor region 288, second insulation distance L2 and third insulation distance L3 secure the insulation distance of 14 mm required by the safety standards. Between seventh conductor region 292 and fifth conductor region 288, eighth insulation distance L8 and ninth insulation distance L9 secure the insulation distance of 14 mm required by the safety standards.

Between first conductor region 182 and fifth conductor region 288, second insulation distance L2 and third insulation distance L3 secure the insulation distance of 14 mm required by the safety standards. Accordingly, first insulation distance L1 and fourth insulation distance L4 may respectively be shorter than 7 mm. FIG. 2 exemplifies that first insulation distance L1=fourth insulation distance L4=5 mm. Insulation distance L41 of insulated type voltage converter 264 and fifth insulation distance L5 of the insulating device incorporated in AC-DC power converter 250 are also identical to fourth insulation distance L4, i.e., 5 mm. Tenth insulation distance L10 is approximately 20 mm, which is an enough spatial distance that is fully longer than a distance ranging from first insulation distance L1 to ninth insulation distance L9.

Figure 3:
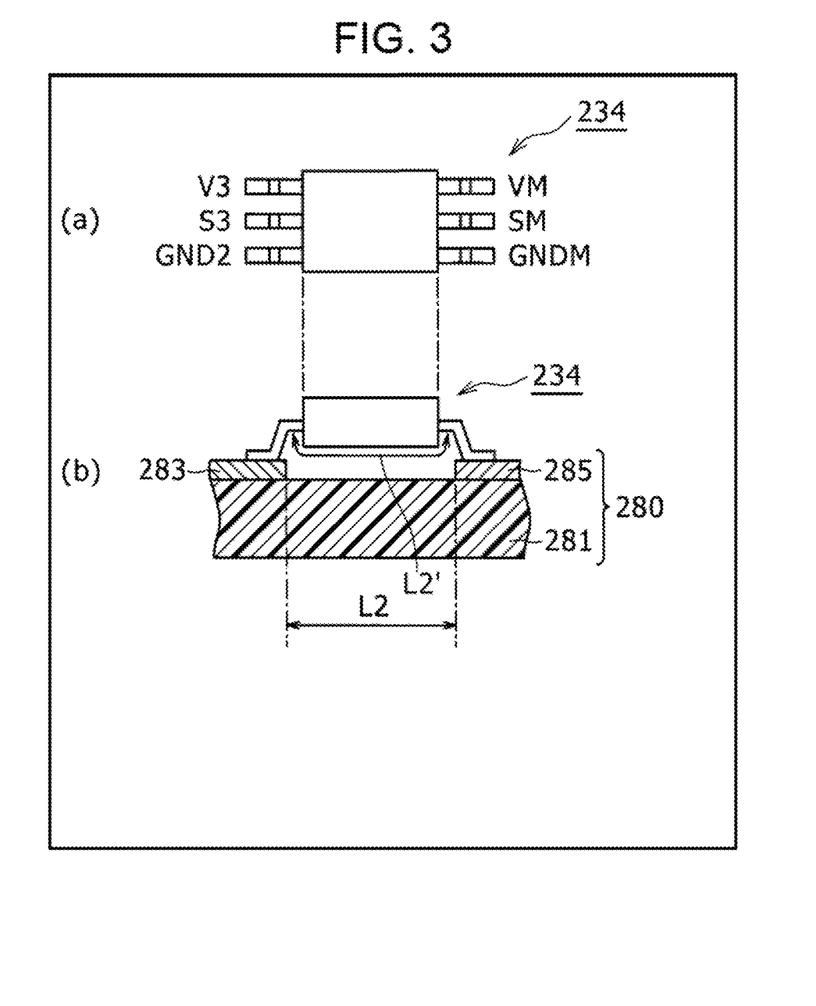
FIG. 3 is a drawing illustrating a second insulating device in FIG. 2.
Figure 4:
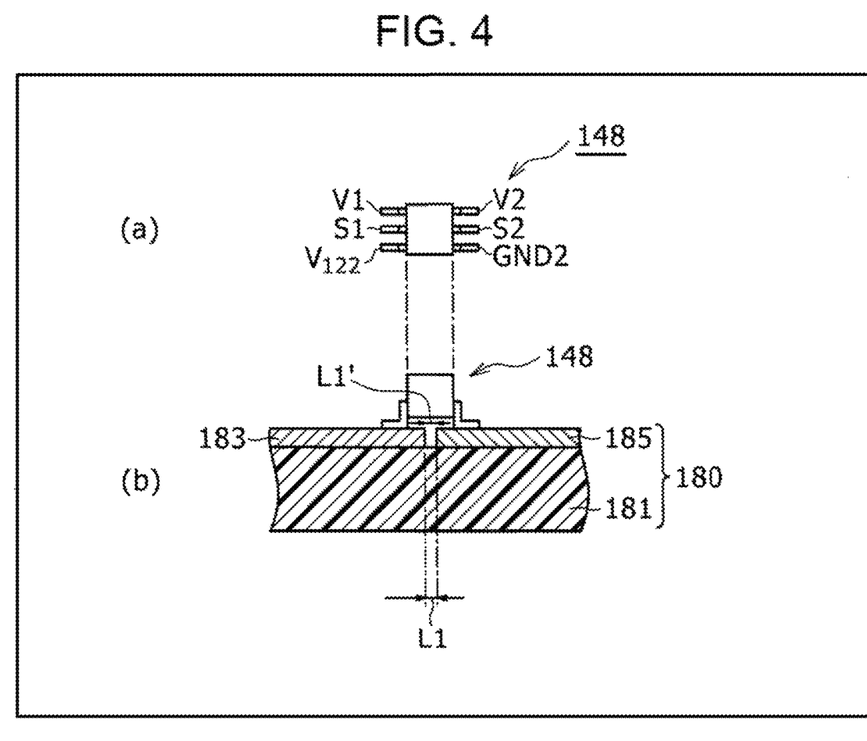
FIG. 4 is a drawing illustrating a first insulating device in FIG. 2.

Second insulating device 234 having second insulation distance L2 and first insulating device 148 having first insulation distance L1 will now be described herein with reference to FIGS. 3, 4. Parts (a) of the drawings are plan views of the devices. Parts (b) of the drawings are side views of the devices respectively installed on control circuit board 280 and battery circuit board 180. Control circuit board 280 and battery circuit board 180 are respectively shown in cross-sectional views in the drawings. FIGS. 3, 4 respectively illustrate second insulating device 234 and first insulating device 148 respectively configured to transmit 1-bit signals. For multi-bit signal transmission, each of the devices may be replaced with an insulating device for multi-bit signal transmission or a plurality of insulating devices for 1-bit signal transmission.

In FIG. 3, second insulating device 234 is a package from which six leads extend: three leads on a primary side, i.e., a lead for V3, a lead for GND2, and a lead for S3 for primary side signals, and three leads on a secondary side, i.e., a lead for VM, a lead for GNDM, and a lead for SM for secondary side signals. In the package, an insulating device and a peripheral circuit for the insulating device are disposed. Second insulating device 234 may be a digital isolator or a photo-coupler.

An area of control circuit board 280, in which second insulating device 234 is installed, includes insulating substrate 281, conductor wiring pattern 283 in third conductor region 282 corresponding to third region 220, and conductor wiring pattern 285 in relay conductor region 284 corresponding to relay region 222. A glass epoxy substrate is used as insulating substrate 281. Conductor wiring patterns 283, 285 are each made from copper conductive foil formed in a predetermined shape. On conductor wiring pattern 283, the three leads on the primary side of second insulating device 234 are soldered. On conductor wiring pattern 285, the three leads on the secondary side of second insulating device 234 are soldered. Second insulating device 234 is thus installed on control circuit board 280.

In part (b) of FIG. 3, a spatial distance included in the insulation distance is a shortest spatial distance between conductor wiring pattern 283 and conductor wiring pattern 285 facing each other, and corresponds to second insulation distance L2. L2 is 7 mm. Therefore, the spatial distance is 7 mm. A creepage distance included in the insulation distance is a distance from each of the leads on the primary side to each of the leads on the secondary side. The creepage distance lies along a surface of the package that is an insulator in second insulating device 234 when second insulating device 234 is installed on control circuit board 280. The creepage distance is indicated as L2' in part (b) of FIG. 3. L2 and L2' exemplified in part (b) of FIG. 3 are approximately identical distances. Therefore, L2 will be used herein as the insulation distance.

L2 is approximately determined by a distance between each of the leads on the primary side and each of the leads on the secondary side of second insulating device 234. At present, in ordinary digital isolators and photo-couplers that are commercially available as insulating devices, a lead on a primary side and a lead on a secondary side are separated at a distance of approximately 9 mm or shorter. Second insulating device 234 may be a commercially available digital isolator or photo-coupler that measures 7 mm in space between a lead on a primary side and a lead on a secondary side, and thus meets a required dielectric withstand voltage.

Third insulating device 236, eighth insulating device 274, and ninth insulating device 278 are insulating devices that are structured and sized identically to second insulating device 234, and respectively have distances between terminals, each of which corresponds to an insulation distance that is equal to second insulation distance L2. Therefore, third insulating device 236, eighth insulating device 274, and ninth insulating device 278 may also be commercially available digital isolators or photo-couplers that measure 7 mm in space between a lead on a primary side and a lead on a secondary side, and thus meet a required dielectric withstand voltage.

In FIG. 4, first insulating device 148 includes three leads on a primary side, i.e., a lead for V1, a lead for voltage V122 of negative electrode terminal 122, and a lead for S1 for primary side signals, and three leads on a secondary side, i.e., a lead for V2, a lead for GND2, and a lead for S2 for secondary side signals. In a package of first insulating device 148, an insulating device and its peripheral circuit are disposed. First insulating device 148 may be a product that is smaller in size than second insulating device 234.

An area of battery circuit board 180, in which first insulating device 148 is installed, includes insulating substrate 181, conductor wiring pattern 183 in first conductor region 182 corresponding to first region 132, and conductor wiring pattern 185 in second conductor region 184 corresponding to second region 134. Details on insulating substrate 181 and conductor wiring patterns 183, 185 are identical to the details on second insulating device 234, and are thus not described. On conductor wiring pattern 183, the three leads on the primary side of first insulating device 148 are soldered. On conductor wiring pattern 185, the three leads on the secondary side of first insulating device 148 are soldered. First insulating device 148 is thus installed on battery circuit board 180.

In part (b) of FIG. 4, a spatial distance included in the insulation distance is a shortest spatial distance between conductor wiring pattern 183 and conductor wiring pattern 185 facing each other, and corresponds to first insulation distance L1. L1 is 5 mm. Therefore, the spatial distance is 5 mm. A creepage distance included in the insulation distance is a distance from conductor wiring pattern 183, via an inter-pattern gap, to conductor wiring pattern 185 when first insulating device 148 is installed on battery circuit board 180. The creepage distance is indicated as L1' in part (b) of FIG. 4. L1 and L1' exemplified in part (b) of FIG. 4 are approximately identical distances. Therefore, L1 will be used herein as the insulation distance.

Although L1 is 5 mm, the required insulation distance of 14 mm is secured with second insulation distance L2 and third insulation distance L3. Therefore, first conductor region 182 and second conductor region 184 may be non-insulated. Therefore, spacing between the leads on the primary side and the leads on the secondary side of first insulating device 148 may be disregarded. When first conductor region 182 and second conductor region 184 are insulated from each other at insulation distance L1, L1 adds a margin to an insulation distance secured with L2+L3 or L6. Therefore, even when an insulation distance secured with L2+L3 and/or L6 does not fully exceed an insulation distance required by the safety standards or is insufficient due to evenness, the insulation distance required by the safety standards can be fully secured with L1+L2+L3 or L1+L6.

FIG. 2 exemplifies that sixth insulation distance L6=(second insulation distance L2+third insulation distance L3)=(eighth insulation distance L8+ninth insulation distance L9)=14 mm. However, insulation distance L1 adds a margin to a required insulation distance. Therefore, even when sixth insulation distance L6, (second insulation distance L2+third insulation distance L3), or (eighth insulation distance L8+ninth insulation distance L9) is shortened, as long as the shortened distance is equal to or below a distance extended by insulation distance L1, an insulation distance required by the safety standards can be secured. Power supply paths to third conductor region 282 and fourth conductor region 286 are formed by a single device, i.e., multi-output power converting unit 252. Signal paths from third conductor region 282 to fourth conductor region 286 are formed by two insulating devices, i.e., second insulating device 234 and third insulating device 236. Therefore, even when sixth insulation distance L6 cannot satisfy an insulation distance achieved by adding second insulation distance L2 and third insulation distance L3, an insulation distance required by the safety standards can be secured by following a relationship of L2=L3>L1, and by extending sixth insulation distance L6 longer than third insulation distance L3 by a length acquired with a calculation of L2(L3)−L1. By at least extending sixth insulation distance L6 longer than third insulation distance L3, an insulation distance between third conductor region 282 and fourth conductor region 286 can be extended longer than third insulation distance L3 achieved by single third insulating device 236, which is advantageous for securing an insulation distance required by the safety standards.

Digital isolators and photo-couplers, which are currently and commercially available as small-sized insulating devices, in which leads on a primary side and leads on a secondary side are each spaced at approximately 4 mm, are inexpensive and affordable as compared with digital isolators and photo-couplers that each having a space of 7 mm between leads of second insulating device 234, and that each offer a high dielectric withstand voltage. First insulating device 148 may be a commercially available, inexpensive digital isolator or photo-coupler that measures approximately 4 mm in space between each of leads on a primary side and each of leads on a secondary side. Fourth insulating device 240 may also be a commercially available, inexpensive digital isolator or photo-coupler that measures approximately 4 mm in space between each of leads on a primary side and each of leads on a secondary side. Since a required insulation distance is disregarded, insulated type voltage converter 264 may be a small-sized, commercially available insulated type DC-DC converter, for example.

Figure 5:
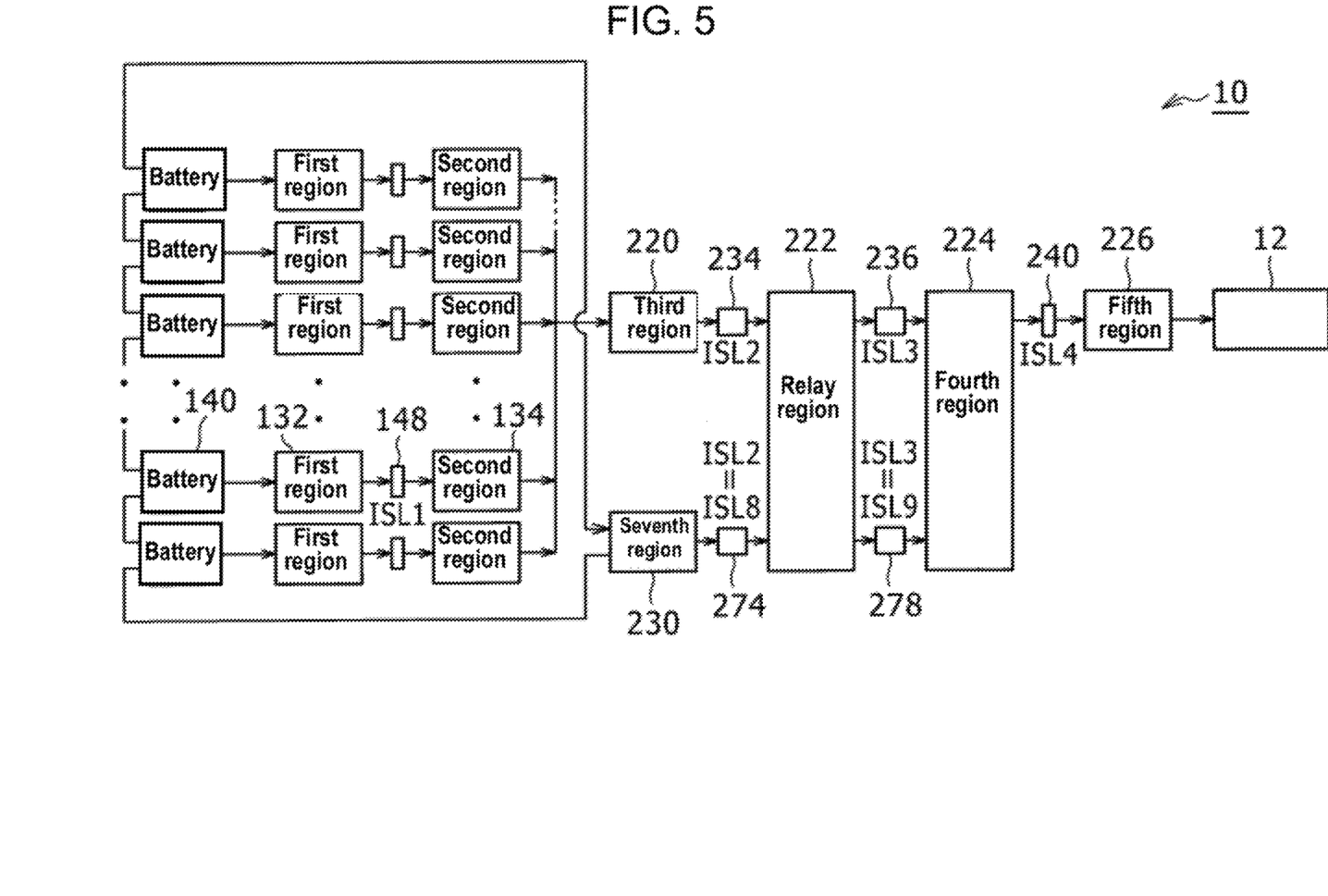
FIG. 5 is a drawing illustrating effects produced by the battery management system according to the present disclosure.

Effects of battery management system 10 configured as described above will now be described herein with reference to FIGS. 5, 6. FIG. 5 is a schematic drawing of the block diagram, shown in FIG. 1, of a portion that relates to transmission of signals.

In consideration of an environment in which battery management system 10 according to the present disclosure is installed, a spatial distance and a creepage distance for reinforced insulating the battery management system need to be 14 mm or longer as described above. In FIG. 5, second insulating device 234 and third insulating device 236 are commercially available digital isolators or photo-couplers that measure 7 mm in space between each of leads on a primary side and each of leads on a secondary side. Therefore, between third region 220 and fourth region 224, an insulation distance of 14 mm can be secured with relay region 222. Eighth insulating device 274 and ninth insulating device 278 may be commercially available digital isolators or photo-couplers that measure 7 mm in space between each of leads on a primary side and each of leads on a secondary side. Therefore, between seventh region 230 and fourth region 224, an insulation distance of 14 mm can be secured with relay region 222.

As to a DC high voltage on the primary side of 800 V and a transient high voltage from a power system, fourth region 224 on the secondary side is protected through reinforced insulation, and therefore first region 132 and second region 134 may be functionally insulated without providing special protection against electric shocks. Therefore, first insulation distance L1 is specified to 5 mm, and first insulating device 148 is a commercially available, inexpensive digital isolator or photo-coupler that measures approximately 5 mm in space between each of leads on a primary side and each of leads on a secondary side. This applies to all batteries 140 of battery module 120. Therefore, as long as the battery management device is secured with a safe insulation distance, a number of battery modules 120 coupled in series may be increased or decreased without changing internal circuits in design. For example, battery module 120 including first insulating device 148 can be added.

Since fourth region 224 is protected through reinforced insulation, transmission of signals to fourth region 224 and onward can be protected at a functional insulation level, and, if a circuit configuration allows, external management device 12 may be non-insulated. Fifth region 226 may be coupled with a plurality of external devices via a plurality of interface units. In such a case, even when fourth region 224 is coupled with a plurality of fifth regions 226, fourth region 224 that is already protected through reinforced insulation may allow the plurality of fifth regions 226 to all be functionally insulated or non-insulated. Further, transmission of data on a voltage between the terminals of battery block 100 to external management device 12 allows prompt management of an operating state of battery block 100, compared with a case when data on voltages of battery module 120 and the battery cells is transmitted to external management device 12. As described above, by using commercially available, ordinary insulating devices, more effective insulation protection can be achieved.

In battery management system 10, an insulation distance required by the safety standards can be provided at a desired location between battery 140 and user interface unit 242. In battery management system 10 according to the present disclosure, the insulating devices are disposed on both sides of relay region 222 to secure an insulation distance required by the safety standards. Instead, such an insulation distance may be achieved in each of battery modules 120. Differences in effects of battery management system 10 according to the present disclosure in such a case will now be described herein with reference to FIG. 6. Battery management systems 300 illustrated in FIG. 6 exemplify that, in each of battery modules 120 configuring each of battery blocks 302, insulating device 304 capable of securing an insulation distance required by the safety standards between first region 132 and second region 134 is provided. Part (a) of FIG. 6 illustrates a case when a voltage between terminals of battery block 302 is approximately several hundred V. Part (b) of FIG. 6 illustrates a case when a voltage between terminals of battery block 302 is approximately 800 V. Similar to FIG. 5, FIG. 6 shows schematic block diagrams.

Figure 6:
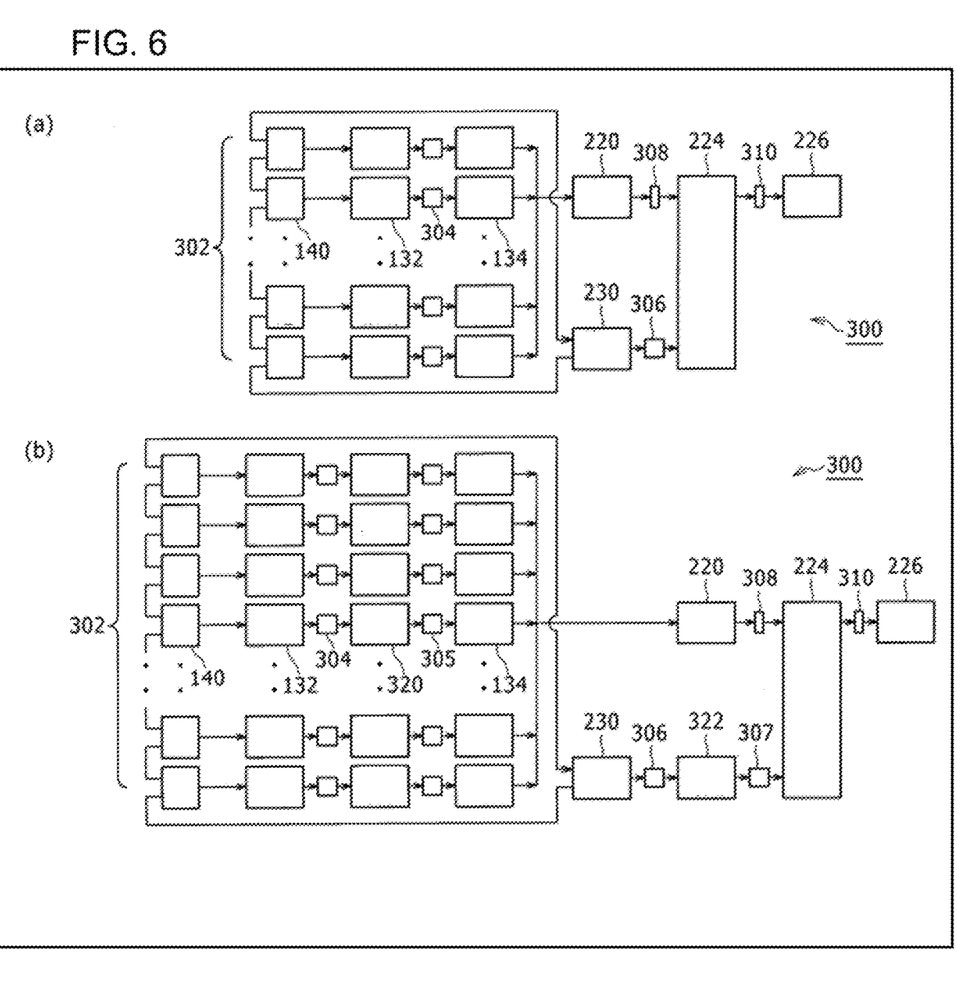
FIG. 6 is a drawing of a comparative example to FIG. 5.

In part (a) of FIG. 6, a number of battery modules 120 coupled in series in battery block 302, which is represented by N, is approximately 10, and a voltage between the terminals is approximately several hundred V. In this case, insulating device 304 may be a digital isolator or a photo-coupler that measures 7 mm in space between each of leads on a primary side and each of leads on a secondary side. Between seventh region 230 and fourth region 224, insulating device 306 that measures 7 mm in space between each of leads on a primary side and each of leads on a secondary side is also used. Insulating devices 304, 306 may each be identical to second insulating device 234 described in FIG. 3. When a number of battery blocks 302 coupled in series, which is represented by N, is 10, a total of eleven insulating devices each equivalent to second insulating device 234 are required, according to an equation of (N+1)=11. In the case of FIG. 5, only four insulating devices each equivalent to second insulating device 234 are required.

Between third region 220 and fourth region 224, and between fourth region 224 and fifth region 226, insulating devices 308, 310 each having an insulation distance satisfying functional insulation are respectively used. In particular, fifth region 226 may be coupled with a plurality of external devices via a plurality of interface units. In such a case, even when fourth region 224 is coupled with a plurality of fifth regions 226, the plurality of fifth regions 226 may all be functionally insulated or non-insulated.

Part (b) of FIG. 6 illustrates a case when, due to a change in specification by a user, for example, a number of battery modules 120 coupled in series, which is represented by N, is increased, compared with part (a), to N=20, the number of which is identical to battery management system 10 according to the present disclosure. At this time, an insulation distance required by the safety standard is 14 mm. Therefore, in each of battery modules 120, relay region 320 is provided between first region 132 and second region 134, and, on both sides of relay region 320, insulating devices 304, 305 each having an insulation distance of 7 mm are disposed. Similarly, relay region 322 is provided between seventh region 230 and fourth region 224, and, on both sides of relay region 322, insulating devices 306, 307 each having an insulation distance of 7 mm are disposed. Insulating devices 304, 305, 306, and 307 are each equivalent to second insulating device 234.

As illustrated in parts (a), (b) of FIG. 6, in the method in which an insulating device capable of securing an insulation distance required by the safety standards is provided in each of battery modules 120, by increasing or decreasing in number battery blocks 302 coupled in series, which is represented by N, a change in an internal configuration of each of battery modules 120 may be required. When seventh region 230 including voltage measuring unit 246 is provided in control device 200, a change in an insulation configuration between the seventh region and fourth region 224 may be required. In part (b) of FIG. 6, when a number of battery modules 120 coupled in series in battery block 302, which is represented by N, is 20, a total of twenty two insulating devices each equivalent to second insulating device 234 are required, according to an equation of {2N+2}=22. In the case of FIG. 5, only four insulating devices each equivalent to second insulating device 234 are required.

As described above, with battery management system 10 according to the present disclosure, commercially available, ordinary insulating devices can be used to provide more effective insulation protection, regardless of a specification of battery block 100.

The invention claimed is:

1. A battery management system comprising:
a battery block formed by coupling in series each other a plurality of battery modules; and
a control device coupled to the battery block with a communication line,
wherein, in the battery block, each of the plurality of the battery modules includes:
a battery;
a battery side controller;
a first communication unit configured to communicate with the control device;
a battery circuit board having:
a first region in which the battery side controller is installed; and
a second region in which the first communication unit is installed, the second region having a GND potential that differs from a GND potential of the first region; and
a first insulating device coupling the first region and the second region at a first insulation distance, the first insulating device being configured to transmit, to the second region, data output from the battery side controller, and
wherein the control device includes:
a second communication unit configured to communicate with the battery block;
a control controller unit;
a control circuit board having:
a third region in which the second communication unit is installed;
a fourth region in which the control controller unit is installed; and
a relay region disposed away at a predetermined second insulation distance from the third region and at a predetermined third insulation distance from the fourth region,
wherein a GND potential of the third region and a GND potential of the fourth region differ from each other;
a second insulating device coupling the third region and the relay region at the second insulation distance, the second insulating device being configured to transmit, to the relay region, data received by the second communication unit; and
a third insulating device coupling the relay region and the fourth region at the third insulation distance, the third insulating device being configured to transmit, to the fourth region, data transmitted by the second insulating device to the relay region,
wherein the first insulation distance is shorter than the second insulation distance and the third insulation distance, and
wherein a required predetermined insulation distance from the first region to the fourth region is set by the second insulating device and the third insulating device.

2. The battery management system according to claim 1, wherein the control device includes, in order to generate predetermined circuit operation power, a circuit power supply coupling unit to which power is supplied from an external circuit power supply that is distinct from the battery block.

3. The battery management system according to claim 2, wherein the external circuit power supply is an alternating current power supply, and
wherein the circuit power supply coupling unit includes an alternating current-direct current power converter configured to convert alternating current power of the external circuit power supply into first direct current power; and
wherein a multi-output power converting unit is configured to use the first direct current power to generate at least predetermined two kinds of the circuit operation power, the multi-output power converting unit includes:
a multi-output transformer configured to convert the first direct current power into first alternating current power, to supply the first alternating current power to a primary side coil, and to output, respectively from a secondary side first coil and a secondary side second coil, the secondary side first coil and the secondary side second coil configuring a secondary side coil, second alternating current power and third alternating current power;
a second power converting unit configured to convert the second alternating current power into second direct current power and to supply the second direct current power to the third region; and
a relay power converting unit configured to convert the third alternating current power into relay direct current power to supply the relay direct current power to the relay region,
wherein, between the secondary side first coil and the secondary side second coil of the multi-output transformer, at least either of an insulation distance or an insulated wire provides an insulation function corresponding to the second insulation distance, and
wherein, between the primary side coil and the secondary side coil of the multi-output transformer, at least either of an insulation distance or an insulated wire provides an insulation function corresponding to an insulation distance greater than the third insulation distance.

4. The battery management system according to claim 3, wherein, for the multi-output power converting unit between the primary side coil and the secondary side coil of the multi-output transformer, at least either of an insulation distance or an insulated wire provides an insulation function corresponding to a distance acquired by adding the second insulation distance and the third insulation distance.

5. The battery management system according to claim 2, wherein the control device further includes a user interface unit used to allow the control controller unit and a user side external device to communicate with each other, and a fifth region in which the user interface unit is installed, and wherein the fifth region is disposed away from the fourth region at a predetermined fourth insulation distance that is shorter than the second insulation distance and the third insulation distance.

6. The battery management system according to claim 1, wherein the control device further includes a voltage measuring unit configured to measure a voltage between terminals of the battery block, and wherein the control circuit board includes:
- a seventh region in which the voltage measuring unit is installed, the seventh region having a GND potential that differs from the GND potential of the third region, a GND potential of the relay region, and the GND potential of the fourth region, the seventh region being disposed away at the second insulation distance from the relay region;
- an eighth insulating device coupling the seventh region and the relay region at the second insulation distance, the eighth insulating device being configured to transmit, to the relay region, data on a voltage between the terminals of the battery block, the voltage being measured by the voltage measuring unit; and
- a ninth insulating device coupling the relay region and the fourth region at the third insulation distance, the ninth insulating device being configured to transmit, to the fourth region, data on the voltage between the terminals of the battery block, the data being transmitted to the relay region by the eighth insulating device.

7. The battery management system according to claim 6, wherein the voltage measuring unit includes:
- a voltage dividing resistor unit configured to divide the voltage between the terminals of the battery block; and
- an analog-digital converter configured to convert, into a digital signal, analog data on a voltage divided by the voltage dividing resistor unit, and wherein the analog-digital converter and the eighth insulating device are assembled in a single package circuit configured to measure a battery voltage.

8. The battery management system according to claim 7, wherein the multi-output power converting unit includes a seventh power converting unit having a secondary side third coil configuring the secondary side coil, the seventh power converting unit being configured to output, from the secondary side third coil, fourth alternating current power, to convert the fourth alternating current power into fourth direct current power, and to supply the fourth direct current power to the seventh region.

9. The battery management system according to claim 7, wherein the single package circuit configured to measure the battery voltage is assembled with a voltage converter configured to generate operation power to be used in the seventh region.

* * * * *